(12) United States Patent
Ikeda et al.

(10) Patent No.: US 10,547,165 B2
(45) Date of Patent: Jan. 28, 2020

(54) ELECTRICAL CONNECTION BOX AND WIRE HARNESS WITH INFILTRATION PROTECTION STRUCTURE

(71) Applicant: Yazaki Corporation, Tokyo (JP)

(72) Inventors: Tatsuhiko Ikeda, Shizuoka (JP); Takaaki Kakimi, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/921,215

(22) Filed: Mar. 14, 2018

(65) Prior Publication Data

US 2018/0309278 A1 Oct. 25, 2018

(30) Foreign Application Priority Data

Apr. 25, 2017 (JP) ................. 2017-086168

(51) Int. Cl.
| | |
|---|---|
| H02G 3/08 | (2006.01) |
| B60R 16/023 | (2006.01) |
| H05K 5/00 | (2006.01) |
| B60R 16/02 | (2006.01) |
| H02G 3/18 | (2006.01) |
| H01B 7/00 | (2006.01) |

(52) U.S. Cl.
CPC ......... *H02G 3/088* (2013.01); *B60R 16/0207* (2013.01); *B60R 16/0238* (2013.01); *H02G 3/18* (2013.01); *H01B 7/0045* (2013.01); *H02G 3/083* (2013.01); *H05K 5/0056* (2013.01)

(58) Field of Classification Search
CPC .......... H02G 3/088; H02G 3/083; H02G 3/18; B60R 16/0207; B60R 16/0238; B60R 16/0239; B60R 16/0215; H01B 7/0045; H05K 5/0056

See application file for complete search history.

(56) References Cited

U.S. PATENT DOCUMENTS

| | | | | |
|---|---|---|---|---|
| 5,925,851 | A * | 7/1999 | Sugahara | ........... H01R 13/5208 174/152 G |
| 6,911,600 | B2 * | 6/2005 | Kiyota | ................. H02G 3/088 16/2.1 |
| 9,214,792 | B2 * | 12/2015 | Kakimi | ................. H02G 3/088 |

(Continued)

FOREIGN PATENT DOCUMENTS

| | | |
|---|---|---|
| CN | 105393417 A | 3/2016 |
| JP | 2001-156469 A | 6/2001 |
| JP | 2002078160 A | 3/2002 |

(Continued)

*Primary Examiner* — Zachary Pape (74) *Attorney, Agent, or Firm* — Sughrue Mion, PLLC (57) ABSTRACT an electrical connection box includes an enclosure, and at least one electronic component housed in the enclosure, where the enclosure includes a housing chamber where the electronic component is housed, a wire outlet configured to allow a wire that is electrically connected to the electronic component to be drawn out from inside to outside, a wire routing space configured to guide, to the wire outlet, the wire that is drawn out from the housing chamber, and an infiltration prevention structure configured to catch, inside the wire routing space, liquid entering from the wire outlet, and where the infiltration prevention structure includes a wall that is configured to catch liquid entering from the wire outlet.

20 Claims, 10 Drawing Sheets

(56) References Cited

U.S. PATENT DOCUMENTS

2015/0214706 A1\* 7/2015 Feng .................. H02G 3/088
                                                                          174/652
2016/0144807 A1 5/2016 Inao et al.

FOREIGN PATENT DOCUMENTS

| JP | 2010093882 A | 4/2010 |
| JP | 2016-007101 A | 1/2016 |

\* cited by examiner

ELECTRICAL CONNECTION BOX AND WIRE HARNESS WITH INFILTRATION PROTECTION STRUCTURE

CROSS-REFERENCE TO RELATED APPLICATION(S)

The present application claims priority to and incorporates by reference the entire contents of Japanese Patent Application No. 2017-086168 filed in Japan on Apr. 25, 2017.

BACKGROUND OF THE INVENTION

1. Field of the Invention

The present invention relates to an electrical connection box, and a wire harness.

2. Description of the Related Art

An electrical connection box including an enclosure and an electronic component housed in the enclosure is conventionally known (Japanese Patent Application Laid-open No. 2016-7101). For example, the electrical connection box is installed in an engine compartment or the like of a vehicle, and electrically connects at least two connection target objects mounted on the vehicle. With this electrical connection box, a wire (such as a power supply line or a signal line) which is electrically connected to an electronic component is drawn out from the inside to the outside of the enclosure, and the electronic component is electrically connected to a connection target object (such as a power source, a load, or a sensor) by the wire. Together with the wire, the electrical connection box forms a wire harness.

Electrical connection boxes of various specifications may be made by changing the types and the numbers of electronic components to be housed inside the enclosure. Accordingly, the electrical connection boxes may conform to specifications of various vehicles, while reducing the cost by using the same enclosure, for example. On the other hand, with such electrical connection boxes, the types and the numbers of wires connected to electronic components change when the types and the numbers of the electronic components change, and thus, the proportion of wires in a wire outlet of the enclosure is different for each specification, and the gap in the wire outlet becomes great depending on the specification. Accordingly, a conventional electrical connection box leaves room for improvement with respect to where liquid such as water entering from the gap can escape.

SUMMARY OF THE INVENTION

Accordingly, the present invention has its object to provide an electrical connection box and a wire harness with increased waterproof ability.

In order to solve the above mentioned problem and achieve the object, an electrical connection box according to one aspect of the present invention includes an enclosure; and at least one electronic component housed in the enclosure, wherein the enclosure includes a housing chamber where the electronic component is housed, a wire outlet configured to allow a wire that is electrically connected to the electronic component to be drawn out from inside to outside, a wire routing space configured to guide, to the wire outlet, the wire that is drawn out from the housing chamber, and an infiltration prevention structure configured to catch, inside the wire routing space, liquid entering from the wire outlet, and the infiltration prevention structure includes a wall that is configured to catch liquid entering from the wire outlet.

According to another aspect of the present invention, in the electrical connection box, it is preferable that the wire routing space includes a guide wall surface that is a wall surface configured to guide the wire inside a space formed by the wall surface and that guides the wire that is drawn out from the wire outlet so as to restrict a routing path of the wire, and the wall includes a liquid stop wall surface that is configured to catch liquid entered along the guide wall surface.

According to still another aspect of the present invention, in the electrical connection box, it is preferable that in a state where the wire outlet in a vehicle-mounted state is seen from below a vehicle, the wall is located so as to cover the housing chamber.

According to still another aspect of the present invention, in the electrical connection box, it is preferable that the enclosure includes a liquid drain port that is configured to discharge liquid that is caught by the wall to outside.

A wire harness according to still another aspect of the present invention includes an electrical connection box including an enclosure configured to house at least one electronic component; and a wire to be electrically connected to the electronic component, wherein the enclosure includes a housing chamber where the electronic component is housed, a wire outlet configured to allow the wire that is electrically connected to the electronic component to be drawn out from inside to outside, a wire routing space configured to guide, to the wire outlet, the wire that is drawn out from the housing chamber, and an infiltration prevention structure configured to catch, inside the wire routing space, liquid entering from the wire outlet, and the infiltration prevention structure includes a wall that is configured to catch liquid entering from the wire outlet.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment of an electrical connection box and a wire harness according to the present invention will be described in detail with reference to the drawings. Additionally, the invention is not limited to the embodiment.

Embodiment

One embodiment of an electrical connection box and a wire harness according to the present invention will be described with reference to FIGS. 1 to 10.

A reference sign 1 in FIGS. 1 to 5 indicates the electrical connection box of the present embodiment. Furthermore, a reference sign WH in FIG. 1 indicates the wire harness of the present embodiment provided with the electrical connection box 1. Additionally, arrows A, B in FIG. 1 indicate views on arrows along a vehicle front-back direction and a vehicle width direction in a vehicle-mounted state. Moreover, an arrow C in FIG. 1 indicates a view on an arrow along an upward direction of a vehicle in a vehicle-mounted state.

Figure 5:
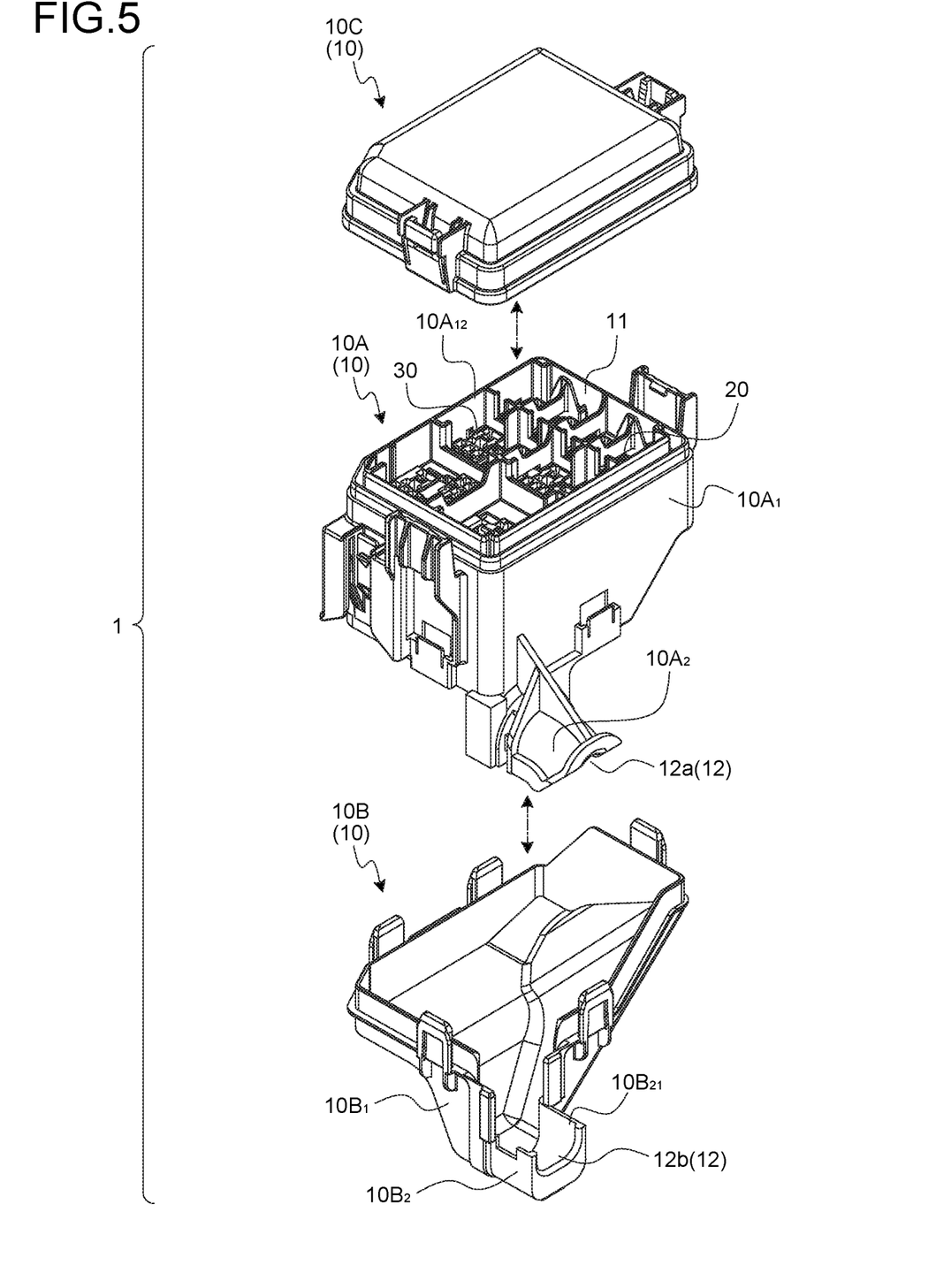
FIG. 5 is an exploded perspective view of the electrical connection box.

The electrical connection box 1 of the present embodiment includes an enclosure 10, and at least one electronic component 20 as a housing target object to be housed in the enclosure 10 (FIG. 5). For example, the electrical connection box 1 is installed in an engine compartment or the like of a vehicle (not illustrated). With the electrical connection box 1, a connection target object (not illustrated) mounted on the vehicle is electrically connected to the electronic component 20, and at least two connection target objects are electrically connected via the electronic component 20. For example, the electronic component 20 is a relay, a circuit protection component such as a fuse, a connector, a terminal fitting, or the like. In the present embodiment, an electronic appliance such as a circuit board or an electronic controller (so-called ECU) is also considered to be a mode of the electronic component 20 to be housed in the enclosure 10. Moreover, in the present embodiment, a so-called electronic component unit having the electronic component 20 housed in another enclosure is also considered to be a housing target object of the enclosure 10. Furthermore, a connection target object is a power source such as a secondary battery, a load such as an electrical appliance (actuator or the like), a sensor, or the like.

With the electrical connection box 1, a wire (such as a power supply line or a signal line) We which is electrically connected to the electronic component 20 is drawn out from the inside to the outside of the enclosure 10 (FIG. 1), and the electronic component 20 is electrically connected to a connection target object by the wire We. Together with the wire We, the electrical connection box 1 forms a wire harness WH. Additionally, the wire We in the drawing is in a state where a plurality of wires are bundled together by a protective member such as a protective tape or a corrugated tube.

The enclosure 10 in this example includes a plurality of separate structural bodies, and is formed by assembling the structural bodies. Each structural body is molded from an insulating material such as a synthetic resin. For example, the illustrated enclosure 10 includes, as the structural bodies, a frame 10A as a housing body for the electronic component 20, a lower cover 10B for blocking one (main opening $10A_{11}$) of two main openings $10A_{11}$, $10A_{12}$ (FIG. 6) of the frame 10A, and an upper cover 10C for blocking the other (main opening $10A_{12}$) of the two main openings $10A_{11}$, $10A_{12}$ (FIGS. 1 to 6).

Figure 6:
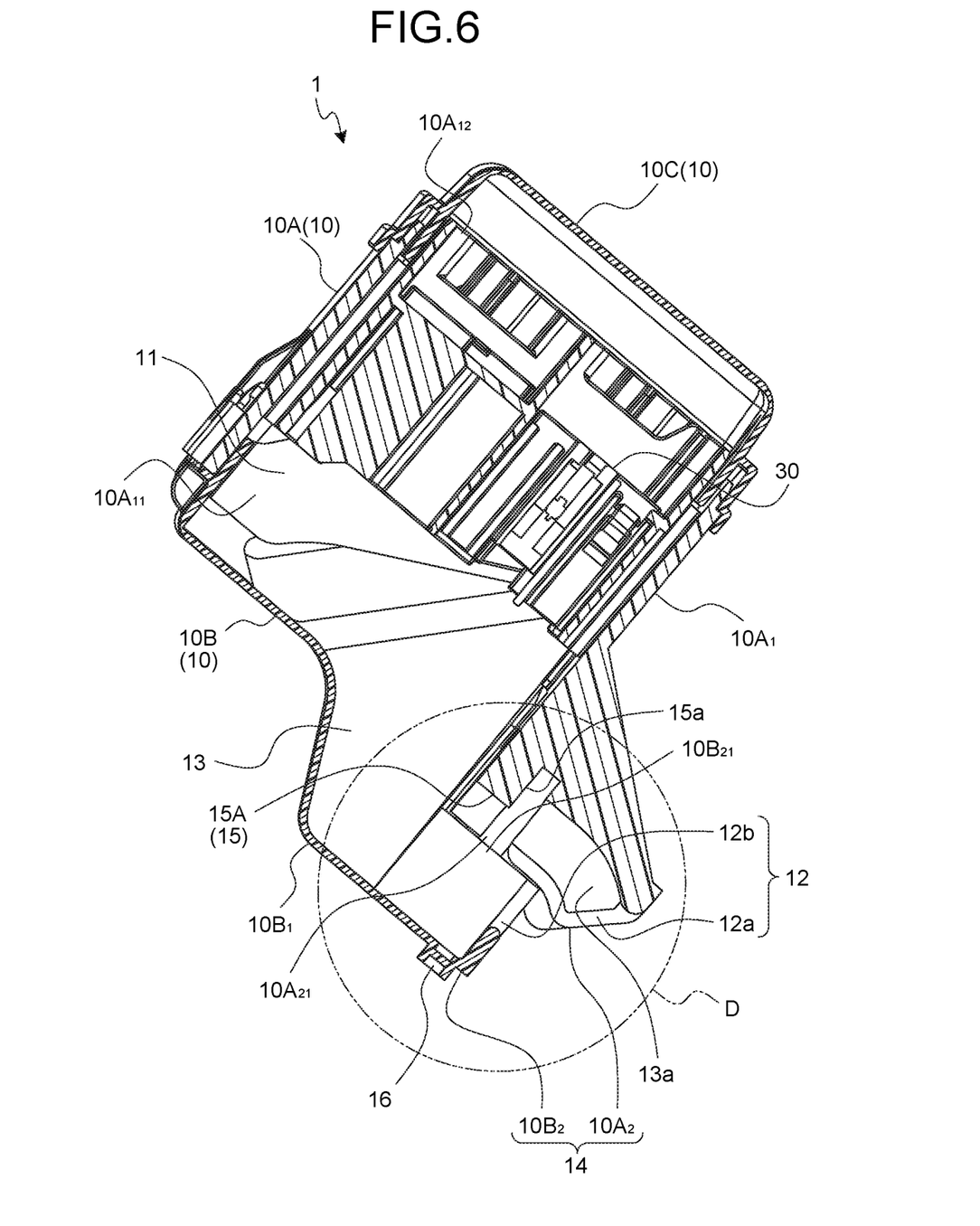
FIG. 6 is a cross-sectional view taken along a line X-X in FIG. 2.

The enclosure 10 includes a housing chamber 11 where the electronic component 20 is housed (FIGS. 5 and 6). With the enclosure 10, a space inside the frame 10A is used as the housing chamber 11. A retention member 30 for retaining the electronic component 20 is housed and fixed in the housing chamber 11. For example, the retention member 30 is referred to as a block in the present technical field, and is molded from an insulating material such as a synthetic resin. The retention member 30 has a housing space where the electronic component 20 is to be housed, and retains the electronic component 20 in the housing space. For example, the electronic component 20 is physically and electrically connected to the wire We in the housing space. That is, the electronic component 20 and the wire We are housed and retained in the housing chamber 11 by the retention member 30, and an electrical connection portion between the electronic component 20 and the wire We is disposed in the housing chamber 11.

Furthermore, the enclosure 10 is provided with a wire outlet 12 through which the wire We is drawn out from the inside to the outside (FIGS. 2, 4, 6, and 7). With this enclosure 10, the wire We is to be drawn out from the housing chamber 11 to the lower cover 10B side, and thus, the wire outlet 12 is provided on the lower cover 10B side. The wire outlet 12 in this example is provided at a boundary between the frame 10A and the lower cover 10B, and is formed by assembling the frame 10A and the lower cover 10B. The wire outlet 12 includes a first opening 12a provided at the frame 10A, and a second opening 12b provided at the lower cover 10B (FIGS. 4 to 7).

Figure 7:
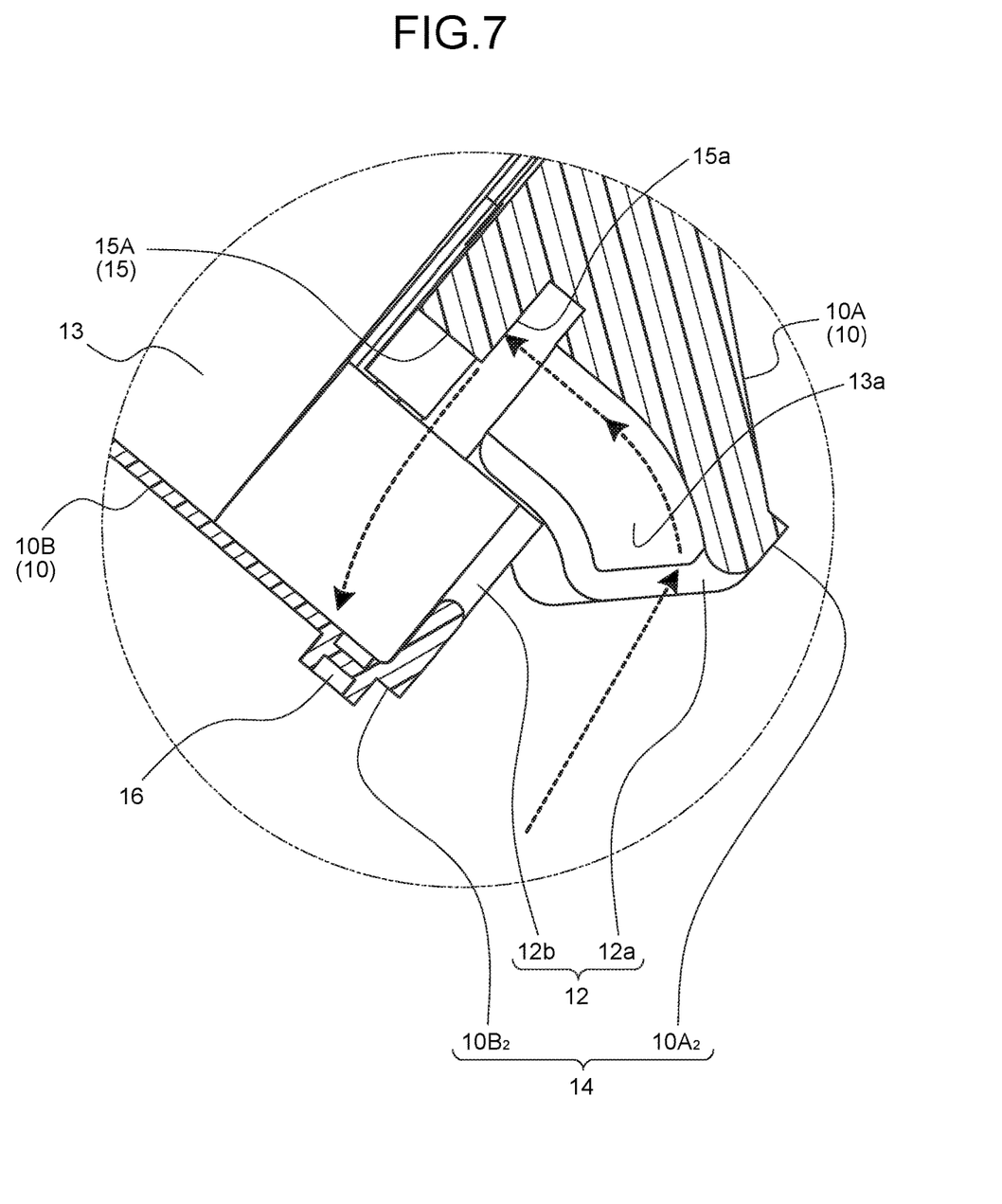
FIG. 7 is an enlarged view of a part D in FIG. 6.
Figure 8:
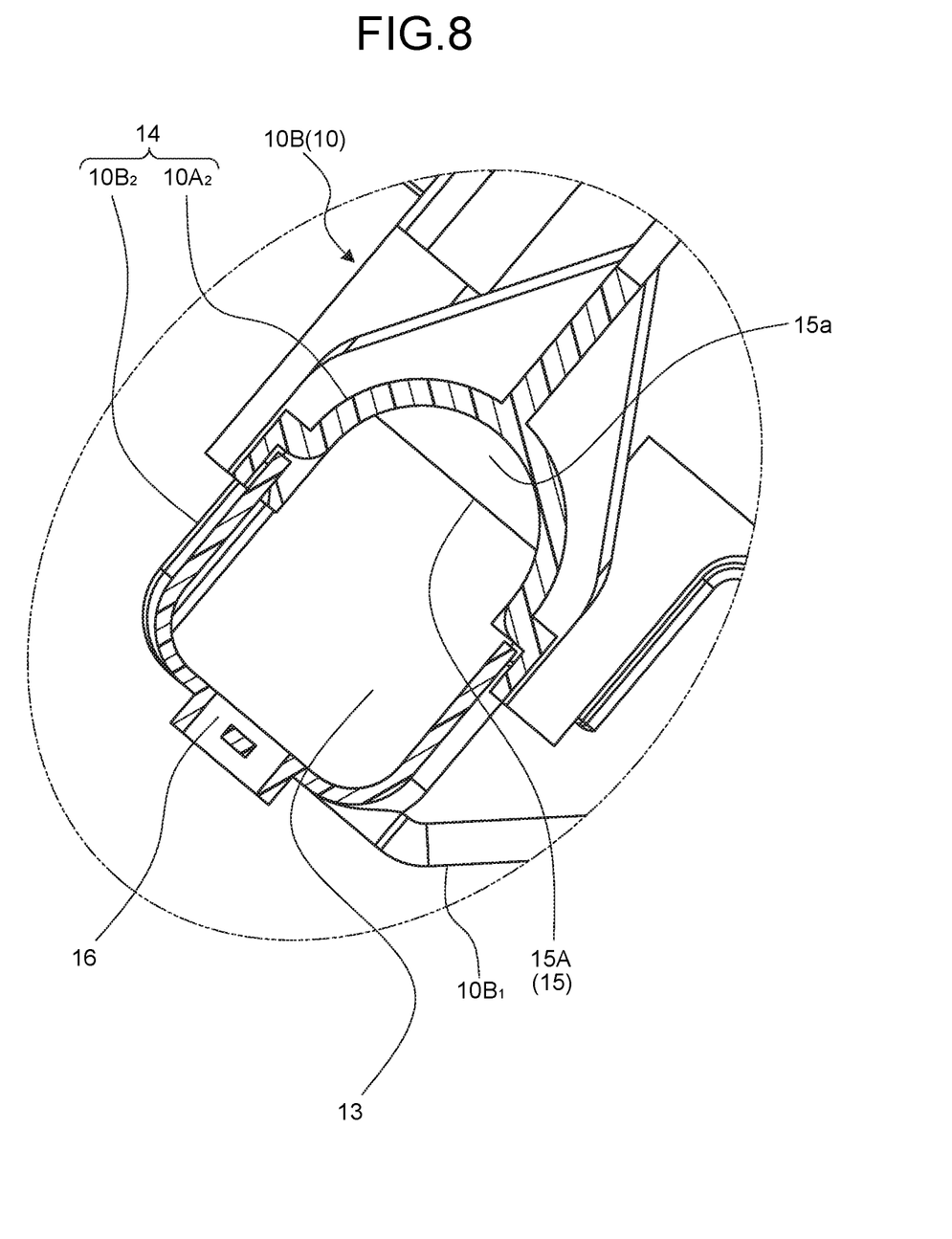
FIG. 8 is a cross-sectional view taken along a line Y-Y in FIG. 3.
Figure 9:
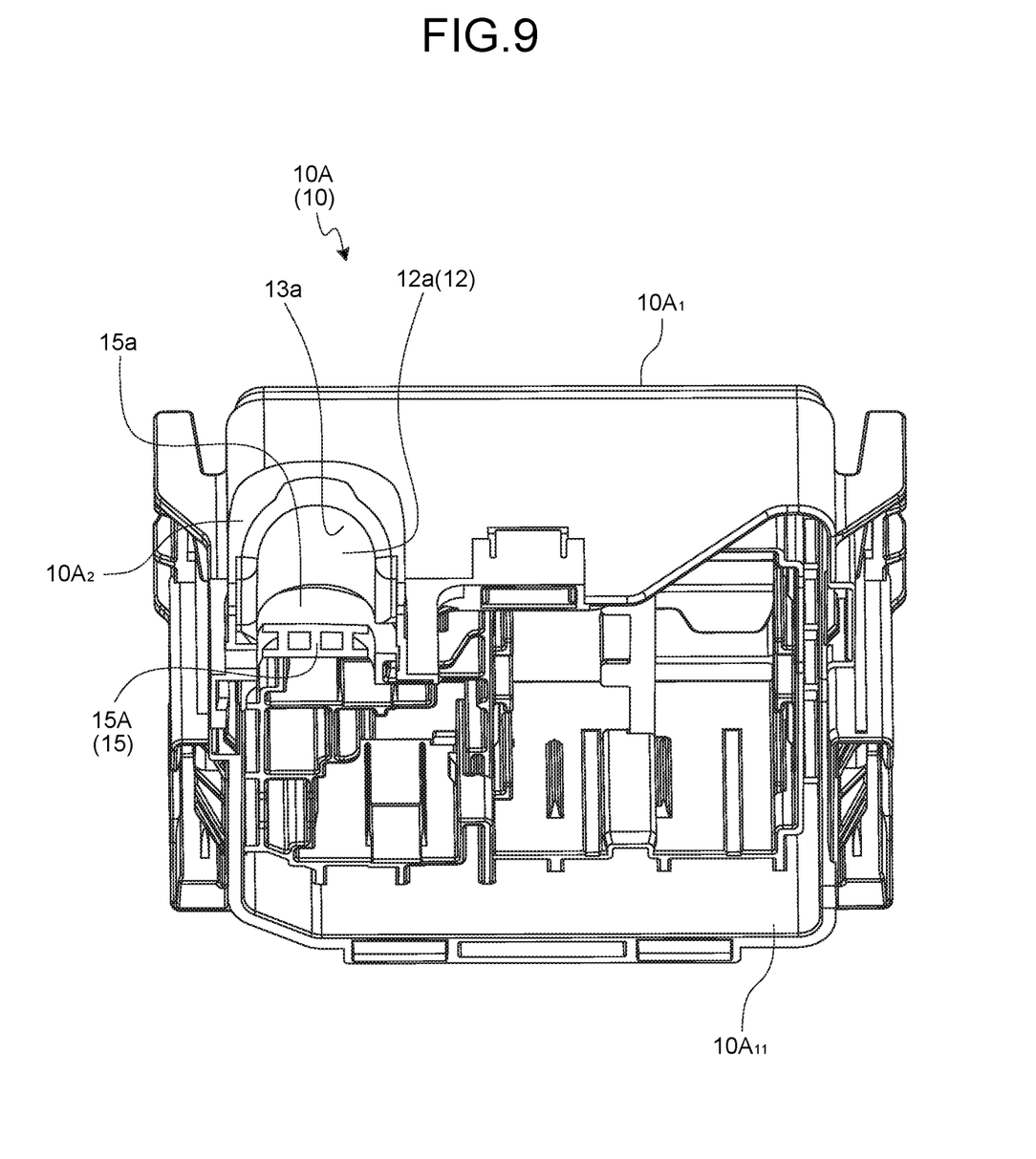
FIG. 9 is a bottom view illustrating a wall of an infiltration prevention structure in a vehicle-mounted state.
Figure 10:
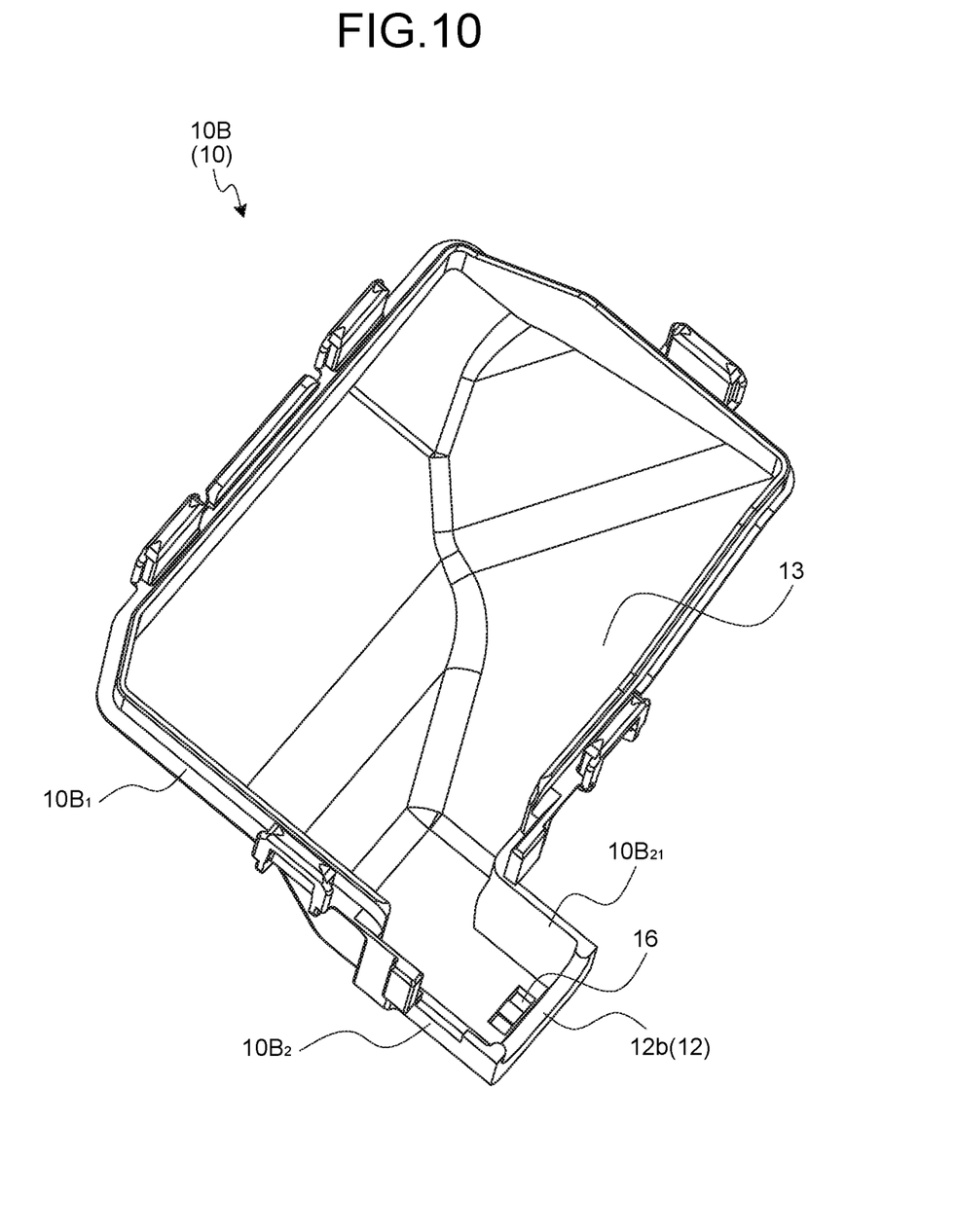
FIG. 10 is a perspective view of a lower cover for describing a liquid drain port.

Furthermore, the enclosure 10 is provided with a space (hereinafter referred to as "wire routing space") 13 for guiding the wire We drawn out from the housing chamber 11 to the wire outlet 12 (FIGS. 6 to 8).

The enclosure 10 uses a space inside the lower cover 10B as the wire routing space 13. The lower cover 10B in this example includes a main body $10B_1$ for blocking one main opening (i.e. main opening $10A_{11}$) of the frame 10A (i.e. housing chamber 11), and a protruding body $10B_2$ protruding from the main body $10B_1$ (FIG. 3, and FIGS. 5 to 7). Here, spaces inside the main body $10B_1$ and the protruding body $10B_2$ are used as the wire routing space 13. The wire We drawn out from the housing chamber 11 is guided to the space inside the main body $10B_1$. The protruding body $10B_2$ is a semi-cylindrical portion for guiding the wire We guided to the main body $10B_1$ to the second opening 12b, and an end opening in the direction of protrusion is used as the second opening 12b. The protruding body $10B_2$ in this example protrudes from the main body $10B_1$ in a direction perpendicular to an assembling direction of the frame 10A and the lower cover 10B. The protruding body $10B_2$ in this example is formed into a semi-angular cylinder, and a bottom wall is coupled to a bottom wall of the main body $10B_1$ to cause a main opening $10B_{21}$ to face the one main opening $10A_{11}$ side of the frame 10A (housing chamber 11) (FIG. 6).

Figure 1:
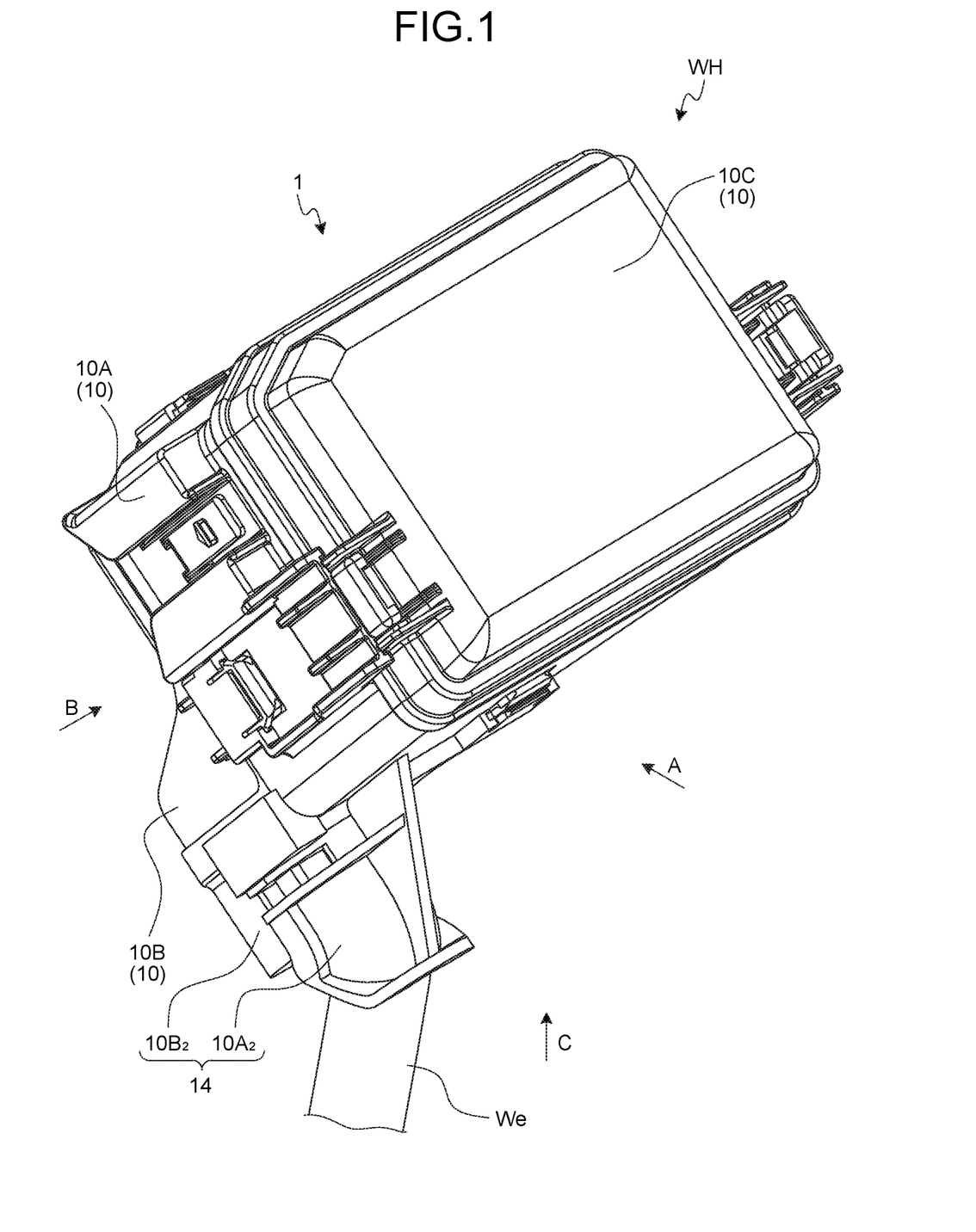
FIG. 1 is a perspective view illustrating an electrical connection box and a wire harness according to an embodiment in a vehicle-mounted state.
Figure 2:
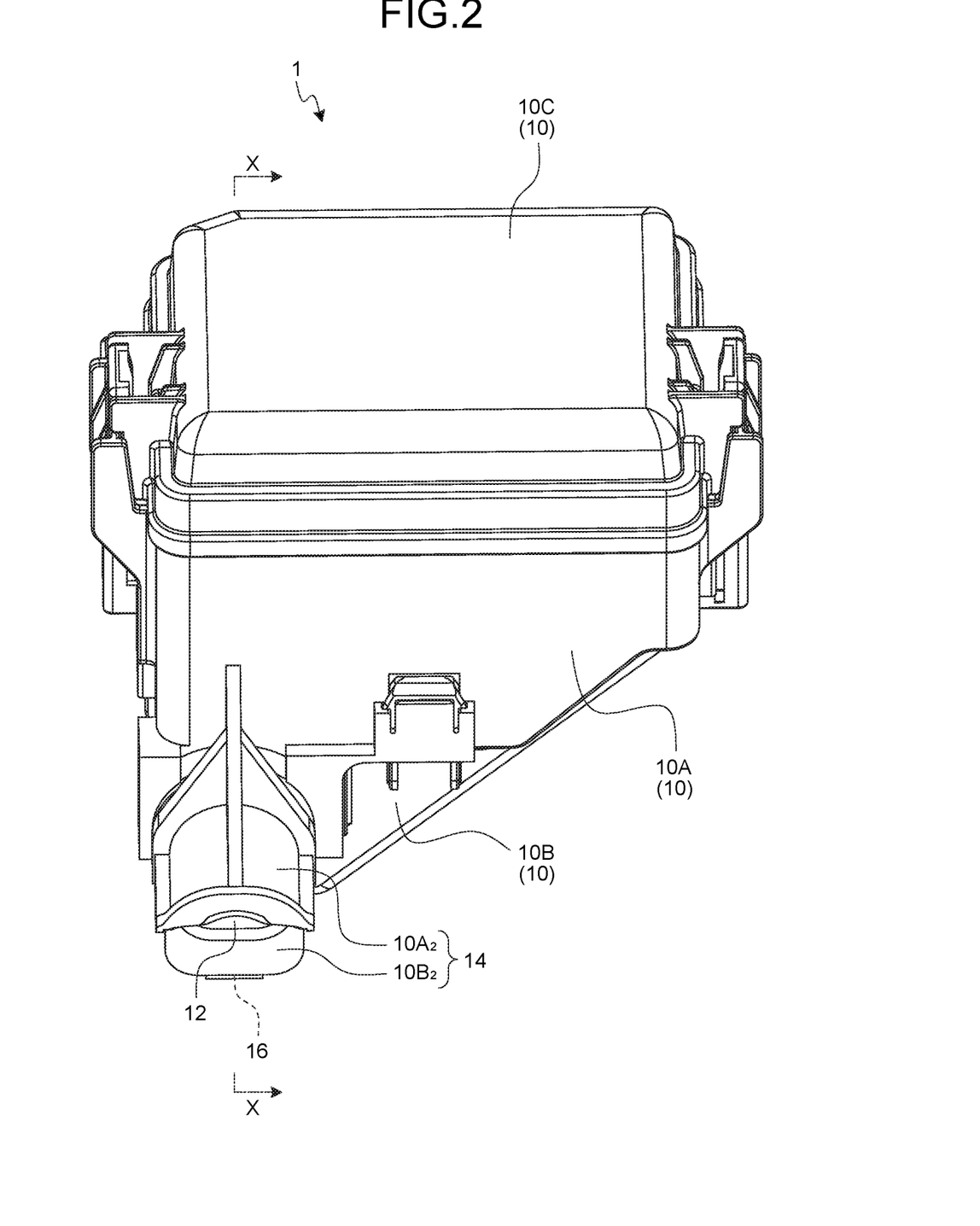
FIG. 2 is a side view of the electrical connection box in a vehicle-mounted state as seen in the direction of an arrow A in FIG. 1.
Figure 3:
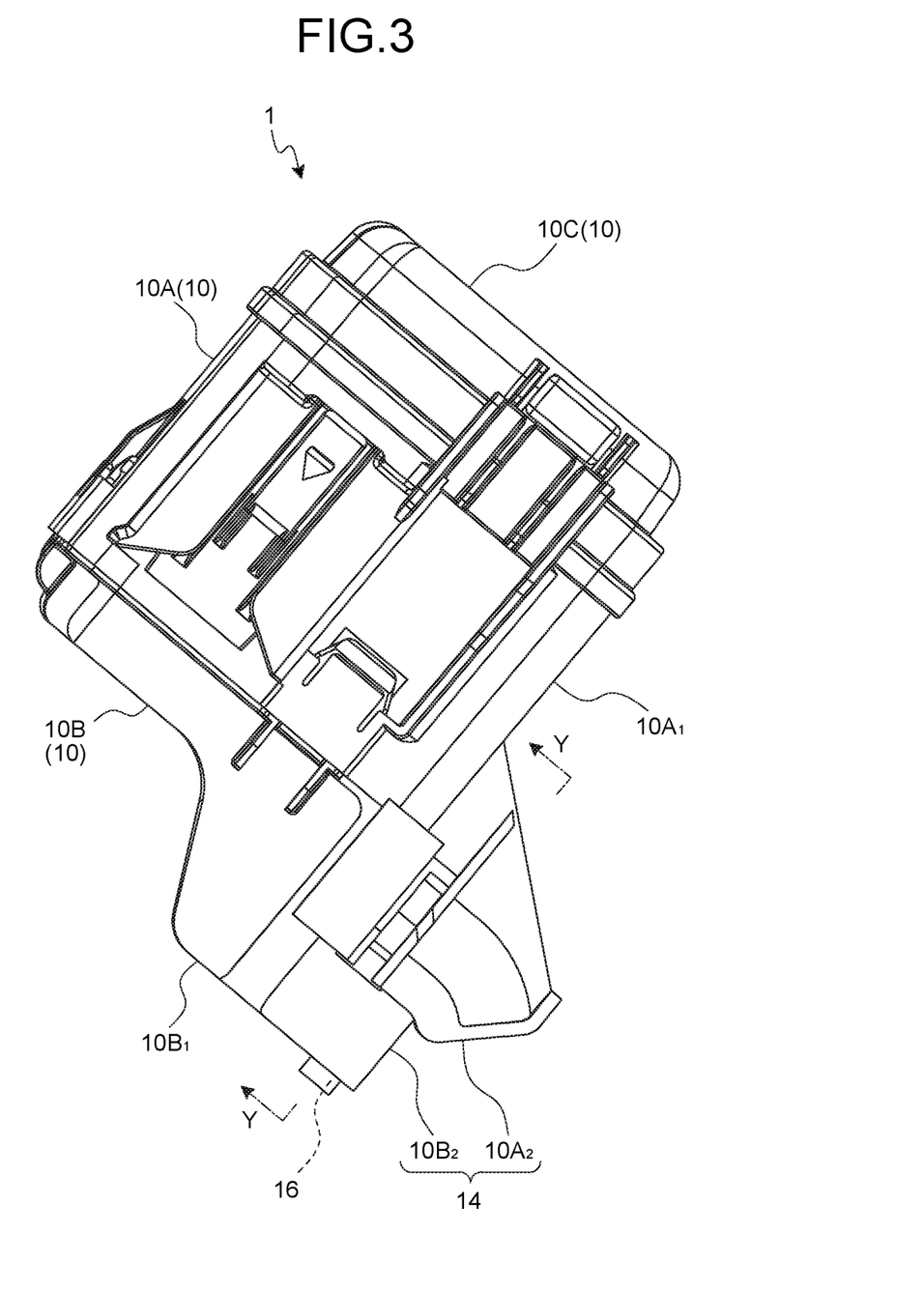
FIG. 3 is a side view of the electrical connection box in a vehicle-mounted state as seen in the direction of an arrow B in FIG. 1.

As described above, the wire outlet 12 of the enclosure 10 is formed from the frame 10A and the lower cover 10B, and thus, a space to be used as the wire routing space 13 is provided also in the frame 10A. The frame 10A in this example includes a cylindrical main body $10A_1$ forming the housing chamber 11 (FIGS. 3, 5, and 6). One opening of the main body $10A_1$ is the main opening $10A_{11}$, and the other opening is the main opening $10A_{12}$. The frame 10A in this example includes a protruding body $10A_2$ protruding from the main body $10A_1$ (FIGS. 3, 5, and 6). The protruding body $10A_2$ is a semi-cylindrical portion for guiding the wire We guided to the main body $10B_1$ of the lower cover 10B to the first opening 12a, and an end opening in the direction of protrusion is used as the first opening 12a. With the enclosure 10, the protruding body 10A$_2$ and the protruding body 10B$_2$ of the lower cover 10B are assembled when the frame 10A and the lower cover 10B are assembled, and a cylindrical wire guide body 14 is thereby formed (FIGS. 1 to 4). The wire guide body 14 is a portion for guiding the wire We guided to the space inside the main body 10B$_1$ of the lower cover 10B to the wire outlet 12, and a space inside the wire guide body 14 is used as a part of the wire routing space 13, and an end opening in the direction of protrusion is used as the wire outlet 12. Accordingly, the protruding body 10A$_2$ in this example protrudes further than the main body 10A$_1$, on the lower cover 10B side than the one main opening 10A$_{11}$ of the main body 10A$_1$, and in the direction perpendicular to the assembling direction of the frame 10A and the lower cover 10B. Here, the protruding body 10A$_2$ is formed as if it is suspended from the main body 10A$_1$. Furthermore, the protruding body 10A$_2$ in this example is formed into a semi-circular cylinder, and a main opening 10A$_{21}$ is provided facing the main opening 10B$_{21}$ of the protruding body 10B$_2$ of the lower cover 10B (FIG. 6).

Figure 4:
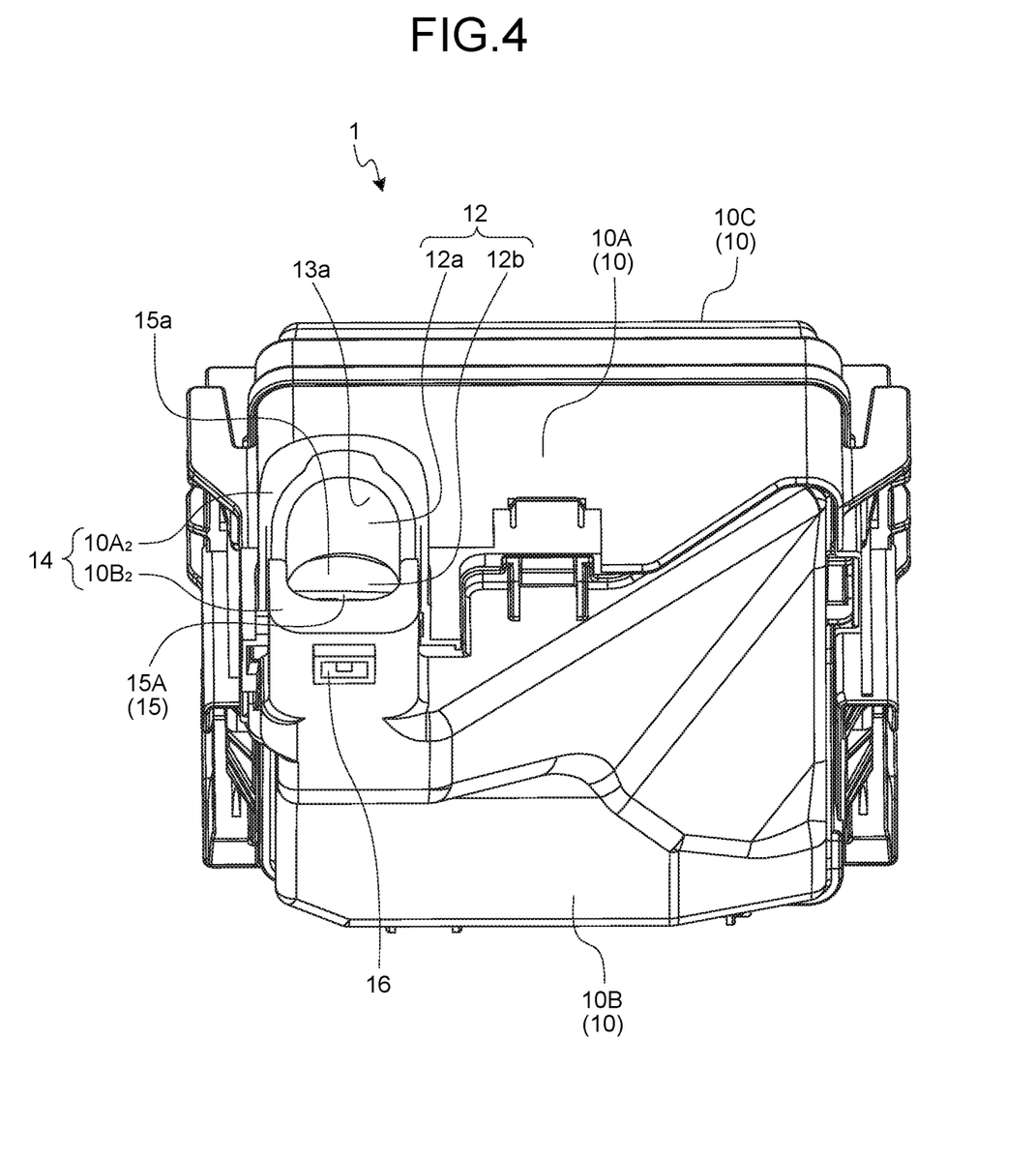
FIG. 4 is a bottom view of the electrical connection box in a vehicle-mounted state as seen in the direction of an arrow C in FIG. 1.

The wire routing space 13 includes a wall surface (hereinafter referred to as "guide wall surface") 13a for guiding the wire We in a space formed by the wall surface (FIGS. 4, 6, and 7). The guide wall surface 13a is a wall surface for restricting a routing path of the wire We which is drawn out from the wire outlet 12. The guide wall surface 13a guides the wire We along its wall surface to the wire outlet 12 so that the wire We is easily routed in a desired direction after being drawn out from the wire outlet 12. For this purpose, the guide wall surface 13a is provided in the space inside the wire guide body 14. Here, all or a part of an inner wall surface of the protruding body 10A$_2$ of the frame 10A is used as the guide wall surface 13a. The protruding body 10A$_2$ in this example protrudes further than the protruding body 10B$_2$ of the lower cover 10B, and an inner wall surface of the protruding portion from the protruding body 10B$_2$ is used as the guide wall surface 13a. The protruding portion is arch-shaped, bending towards the protruding body 10B$_2$ of the lower cover 10B, and the wire We is to be guided along the arch-shaped guide wall surface 13a. The first opening 12a, which is an opening end portion of the protruding portion, is thereby inclined with respect to the second opening 12b.

As described above, electrical connection boxes 1 of various specifications may be made by changing the types and the numbers of electronic components 20 to be housed in the housing chamber 11, and by changing the types and the numbers of wires We in accordance with the electronic components 20. Accordingly, with the electrical connection box 1, the types and the numbers of wires We to be drawn out from the wire outlet 12 are changed depending on the specifications, and thus, the proportion of the wires We in the wire outlet 12 is also changed, and the gap in the wire outlet 12 is increased as the proportion is reduced. For example, in FIG. 6, the electrical connection box 1 is illustrated as being in a vehicle-mounted state, and a top-bottom direction on the page corresponds to a top-bottom direction of the vehicle. Accordingly, with the electrical connection box 1, for example, in the case where the gap in the wire outlet 12 is large, if liquid, such as water, is splashed off from a vehicle body towards the wire outlet 12, the liquid possibly enters through the gap. Particularly, if the liquid enters from the first opening 12a, depending on the force of the liquid, the liquid may reach the housing chamber 11.

Accordingly, the enclosure 10 of the present embodiment includes an infiltration prevention structure 15 for catching, in the space of the wire routing space 13, liquid entering from the wire outlet 12 (FIG. 4, and FIGS. 6 to 9). The infiltration prevention structure 15 in this example includes a wall 15A provided in the space inside the wire guide body 14, and liquid entering from the wire outlet 12 is caught by the wall 15A and inflow of liquid therefrom (that is, towards the housing chamber 11) is prevented.

The wall 15A is provided in a manner standing from the inner wall surface of the protruding body 10A$_2$ of the frame 10A. The wall 15A in this example includes a liquid stop wall surface 15a for catching liquid entered along the guide wall surface 13a (for example, as indicated by arrows in FIG. 7) (FIG. 4, and FIGS. 6 to 9). Furthermore, in a state where the wire outlet 12 in a vehicle-mounted state is seen from below the vehicle, the wall 15A is located so as to cover the housing chamber 11. The wall 15A is formed and disposed in a manner satisfying these requirements, while not obstructing routing of the wire We. Accordingly, the wall 15A can catch liquid entering from the wire outlet 12 and flowing towards the inner wall surface of the protruding body 10A$_2$ (including the guide wall surface 13a), and can catch liquid entering from the wire outlet 12 and flowing towards a top side of the vehicle.

The enclosure 10 of the present embodiment includes a liquid drain port 16 for draining liquid caught by the wall 15A to outside (FIGS. 2 to 4, FIGS. 6 to 8, and FIG. 10). The liquid drain port 16 is provided in the space inside the wire guide body 14. In this example, a through hole is formed on the bottom wall of the protruding body 10B$_2$ of the lower cover 10B, and this through hole is used as the liquid drain port 16. The liquid drain port 16 is formed in such a way that an opening on an outlet side faces a bottom side of the vehicle when in a vehicle-mounted state. Additionally, with the enclosure 10, liquid which is not caught by the wall 15A flows towards the inner wall surface of the lower cover 10B and is discharged from the liquid drain port 16 to the outside.

As described above, with the electrical connection box 1 of the present embodiment, even if a gap is formed to the wire outlet 12 depending on the types and the numbers of wires We, and liquid, such as water, enters through the gap, the liquid can be caught before reaching the housing chamber 11 by the infiltration prevention structure 15 including the wall 15A. Furthermore, with the electrical connection box 1, because liquid entering in the above manner does not flow towards the electronic component 20 in the housing chamber 11, durability of the electronic component 20 and the wire We connected to the electronic component 20 may be increased. Accordingly, the electrical connection box 1 of the present embodiment may conform to specifications of various vehicles and achieve increased waterproof ability, while reducing the cost by using the same enclosure 10, for example. Furthermore, with the electrical connection box 1 of the present embodiment, liquid caught by the wall 15A is discharged from the liquid drain port 16 to outside the enclosure 10, and thus, liquid remaining inside the enclosure 10 may be prevented from flowing towards the housing chamber 11. Accordingly, also in this aspect, the electrical connection box 1 may increase durability of the electronic component 20 and the wire We connected to the electronic component 20. Accordingly, the electrical connection box 1 of the present embodiment may conform to specifications of various vehicles and achieve even more increased waterproof ability, while reducing the cost by using the same enclosure 10, for example.

Moreover, the wire harness WH of the present embodiment includes the electrical connection box 1, and is thus able to achieve the effect of the electrical connection box 1.

With the electrical connection box according to the present embodiment, even if a gap is formed in the wire outlet depending on the types and the numbers of wires, and liquid such as water enters through the gap, the liquid can be caught before reaching a housing chamber by an infiltration prevention structure including a wall. With the electrical connection box, because liquid entering in the above manner does not flow towards an electronic component in the housing chamber, durability of the electronic component or a wire connected to the electronic component may be increased. Accordingly, the electrical connection box may conform to specifications of various vehicles and achieve increased waterproof ability, while reducing the cost by using the same enclosure, for example. Furthermore, the wire harness according to the present embodiment includes such an electrical connection box, and is thus able to achieve the effect of the electrical connection box.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
    an enclosure; and
    at least one electronic component housed in the enclosure, wherein
    the enclosure includes
        a frame configured to form a housing chamber where the electronic component is housed,
        a lower cover, separate from the frame, and configured to block one of two main openings of the frame,
        an upper cover, separate from the frame and the lower cover, and configured to block a second one of the two main openings of the frame at a position of the frame opposite to the one of the two main openings,
        a wire outlet configured to be formed by assembling the frame and the lower cover and allow a wire that is electrically connected to the electronic component to be drawn out from inside to outside,
        a wire routing space configured to guide, to the wire outlet, the wire that is drawn out from the housing chamber, where types and numbers of the wire change according to a specification of a vehicle, and
        an infiltration prevention structure configured to catch, inside the wire routing space, liquid entering from the wire outlet, and
    the infiltration prevention structure includes a wall that is configured to catch liquid entering from the wire outlet.

2. The electrical connection box according to claim 1, wherein
    the wire routing space includes a guide wall surface that is a wall surface configured to guide the wire inside a space formed by the wall surface and that guides the wire that is drawn out from the wire outlet so as to restrict a routing path of the wire, and
    the wall includes a liquid stop wall surface that is configured to catch liquid entered along the guide wall surface.

3. The electrical connection box according to claim 2, wherein
    in a state where the wire outlet in a vehicle-mounted state is seen from below a vehicle, the wall is located so as to cover the housing chamber.

4. The electrical connection box according to claim 2, wherein
    the enclosure includes a liquid drain port that is configured to discharge liquid that is caught by the wall to outside.

5. The electrical connection box according to claim 1, wherein
    in a state where the wire outlet in a vehicle-mounted state is seen from below a vehicle, the wall is located so as to cover the housing chamber.

6. The electrical connection box according to claim 1, wherein
    the enclosure includes a liquid drain port that is configured to discharge liquid that is caught by the wall to outside.

7. The electrical connection box according to claim 6, wherein
    the liquid drain port is located below the infiltration prevention structure.

8. The electrical connection box according to claim 1, wherein the wall is provided in a manner standing from an inner wall surface of a protruding body of the frame.

9. The electrical connection box according to claim 1, wherein a first opening is directly joined to a guide wall which is adjacent to and curved about a side of a second opening.

10. The electrical connection box according to claim 9, wherein the guide wall is extended from the first opening to the infiltration prevention structure.

11. The electrical connection box according to claim 10,
    wherein the wire outlet comprises the first opening to an outside of the housing chamber,
    wherein the wire outlet comprises the second opening to the outside of the housing chamber, and
    wherein, in a direction in which the wire is drawn out from the housing chamber, the first opening is protruded further away from the housing chamber than the second opening is protruded away from the housing chamber.

12. The electrical connection box according to claim 1,
    wherein the infiltration prevention structure is extended from the frame in a direction away from the upper cover.

13. The electrical connection box according to claim 1, wherein
    the infiltration prevention structure is located, in a direction from the lower cover to the upper cover, above at least part of the wire routing space.

14. The electrical connection box according to claim 1, wherein
    the enclosure includes a liquid drain port that is configured to discharge liquid that is caught by the wall to outside, and a corner that is a part connected to the wire outlet, the corner accumulates liquid received by the wall and liquid not received by the wall.

15. The electrical connection box according to claim 1, wherein
    the lower cover and the frame comprise ones of a plurality of locking projections,
    the lower cover and frame are configured to be attached together by attachment of the locking projections.

16. A wire harness comprising:
an electrical connection box including an enclosure configured to house at least one electronic component; and
a wire to be electrically connected to the electronic component, wherein
the enclosure includes
- a frame configured to form a housing chamber where the electronic component is housed,
- a lower cover, separate from the frame, and configured to block one of two main openings of the frame,
- an upper cover, separate from the frame and the lower cover, and configured to block a second one of the two main openings of the frame at a position of the frame opposite to the one of the two main openings
- a wire outlet configured to be formed by assembling the frame and the lower cover and allow the wire that is electrically connected to the electronic component to be drawn out from inside to outside,
- a wire routing space configured to guide, to the wire outlet, the wire that is drawn out from the housing chamber, where types and numbers of the wire change according to a specification of a vehicle, and
- an infiltration prevention structure configured to catch, inside the wire routing space, liquid entering from the wire outlet, and
the infiltration prevention structure includes a wall that is configured to catch liquid entering from the wire outlet.

17. The wire harness according to claim 16, wherein the wall is provided in a manner standing from an inner wall surface of a protruding body of the frame.

18. The wire harness according to claim 16, wherein
the infiltration prevention structure is extended from the frame in a direction away from the upper cover.

19. The wire harness according to claim 16, wherein
the infiltration prevention structure is located, in a direction from the lower cover to the upper cover, above at least part of the wire routing space.

20. The wire harness according to claim 16, wherein
the enclosure includes a liquid drain port that is configured to discharge liquid that is caught by the wall to outside,
the liquid drain port is located below the infiltration prevention structure.

\* \* \* \* \*